(12) United States Patent
Shiobara

(10) Patent No.: US 9,762,180 B2
(45) Date of Patent: Sep. 12, 2017

(54) VOLTAGE CONTROLLED OSCILLATOR

(71) Applicant: NIHON DEMPA KOGYO CO., LTD., Tokyo (JP)

(72) Inventor: Tsuyoshi Shiobara, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 0 days.

(21) Appl. No.: 15/123,681

(22) PCT Filed: Mar. 11, 2015

(86) PCT No.: PCT/JP2015/001339
§ 371 (c)(1),
(2) Date: Sep. 6, 2016

(87) PCT Pub. No.: WO2015/141190
PCT Pub. Date: Sep. 24, 2015

(65) Prior Publication Data
US 2017/0019064 A1   Jan. 19, 2017

(30) Foreign Application Priority Data
Mar. 20, 2014 (JP) .................................. 2014-058210

(51) Int. Cl.
*H03B 5/32* (2006.01)
*H03B 5/04* (2006.01)
(Continued)

(52) U.S. Cl.
CPC ................. *H03B 5/04* (2013.01); *H03B 5/32* (2013.01); *H03B 5/366* (2013.01); *H03B 5/368* (2013.01);
(Continued)

(58) Field of Classification Search
CPC ........... H03L 1/00; H03L 1/025; H03B 5/368; H03B 5/04; H03B 5/32; H03B 5/366; H03B 2200/0008
(Continued)

(56) References Cited

U.S. PATENT DOCUMENTS 4,412,188 A * 10/1983 Helle ...................... H03L 1/023
331/176
5,428,319 A * 6/1995 Marvin ................... H03L 1/025
331/116 R

FOREIGN PATENT DOCUMENTS

JP    S47-024905    10/1972
JP    S63-129313    8/1988
(Continued)

OTHER PUBLICATIONS

"International Search Report (Form PCT/ISA/210) of PCT/JP2015/001339", dated May 26, 2015, with English translation thereof, pp. 1-4.

*Primary Examiner* — Arnold Kinkead
(74) *Attorney, Agent, or Firm* — Jianq Chyun IP Office

(57) ABSTRACT

An oscillator includes a front side voltage divider, a rear side voltage divider, and an oscillation unit. The front side voltage divider includes a first resistor connected between a first and second potential sources, and a first output terminal configured to changeably connect to a connection position in the first resistor so as to vary an obtained output voltage. The rear side voltage divider includes a second resistor connected between the first output terminal and a third potential source; and a second output terminal configured to changeably connect to a connection position in the second resistor so as to vary an obtained output voltage. The oscillation unit includes a variable capacitance element with a capacitance varied according to the output voltage from the second output terminal. The oscillation unit varies an output fre- (Continued)

quency based on a variation in a resonance point associated with a variation in the capacitance.

7 Claims, 6 Drawing Sheets

(51) Int. Cl.
*H03L 1/02* (2006.01)
*H03L 1/00* (2006.01)
*H03B 5/36* (2006.01)

(52) U.S. Cl.
CPC ................ *H03L 1/00* (2013.01); *H03L 1/025* (2013.01); *H03B 2200/0008* (2013.01)

(58) Field of Classification Search
USPC .................... 331/177 V, 158, 116 FE, 176
See application file for complete search history.

(56) References Cited

FOREIGN PATENT DOCUMENTS

| | | |
|---|---|---|
| JP | H02-214313 | 8/1990 |
| JP | H09-298422 | 11/1997 |
| JP | 2000183650 | 6/2000 |
| JP | 2003069343 | 3/2003 |
| JP | 2003304119 | 10/2003 |
| JP | 2011171828 | 9/2011 |
| JP | 2012138890 | 7/2012 |

\* cited by examiner

VOLTAGE CONTROLLED OSCILLATOR

CROSS-REFERENCE TO RELATED APPLICATION

This application is a 371 of international application of PCT application serial no. PCT/JP2015/001339, filed on Mar. 11, 2015, which claims the priority benefits of Japan Patent Application No. 2014-058210, filed on Mar. 20, 2014. The entirety of each of the above-mentioned patent applications is hereby incorporated by reference herein and made a part of this specification.

TECHNICAL FIELD

The disclosure relates to a voltage controlled oscillator configured to freely vary a frequency.

BACKGROUND ART

An example of a voltage controlled oscillator (VCO: Voltage Control Oscillator) includes a voltage control crystal oscillator (VCXO: Voltage Control Crystal Oscillator), and an output frequency of this VCXO is controlled by a supplied control voltage. For example, a VCXO used for a base station of mobile phones oscillates so as to be synchronized with a received GPS (Global Positioning System) signal. There is a case where some kind of cause makes it impossible to receive this GPS signal. In such a case, the VCXO is required to have superior holdover performance. That is, even if the GPS signal cannot be received, the VCXO is required to oscillate at a predetermined frequency and with high accuracy. In addition, it has been considered to enhance the communication speed between the mobile phone and the base station. In order to enhance the communication speed, it is required to ensure not only an increased frequency but also a high accuracy in a predetermined frequency. Due to these circumstances, it is also required that an output of the output frequency of the VCXO is controlled with higher accuracy.

Incidentally, at a production stage of the VCXO, each component that constitutes the VCXO is exchanged by a manufacturer while confirming an oscillation frequency actually output from the VCXO, and the components that ensure the desired output frequency are employed. However, after the components employed in such a manner are stored in a package, these components are possibly heated and deaerated with the package to prevent oxidation, or are possibly exposed to an inert gas atmosphere sealed in the package to prevent oxidation. That is, the respective components that constitute the VCXO are stored in different environments at the production stage and after the production. Even if the identical control voltage as the control voltage supplied at the production stage is supplied to the VCXO after the production, this may cause the output frequency to be lightly deviated from the frequency obtained at the production stage. Due to these circumstances, it is desired that the VCXO ensures adjusting an oscillation output finely after the production.

Japanese Unexamined Patent Application Publication No. 2012-138890 discloses a VCXO provided with a digital potentiometer in order to adjust an oscillation frequency. However, the number of taps of the digital potentiometer with the highest resolution is currently about 1024, and the only one digital potentiometer is included in this oscillator. In order to control the output frequency with high accuracy as described above, it is desired that a technique ensures adjusting the oscillation frequency more finely than a configuration of this Patent Literature 1 is required. While Japanese Unexamined Patent Application Publication No. 2011-171828 and Japanese Unexamined Patent Application Publication No. 2000-183650 also disclose a VCXO provided with a potentiometer, the VCXO cannot solve such a problem.

The disclosure has been made in view of the above-described problems, and it is an object of the disclosure to provide a voltage controlled oscillator that controls an output frequency with high accuracy.

Solutions to the Problems

A voltage controlled oscillator according to the disclosure includes a front side voltage divider, a rear side voltage divider, and an oscillation unit. The front side voltage divider includes a first resistor connected between a first potential source and a second potential source and a first output terminal configured to changeably connect to a connection position in the first resistor so as to vary an obtained output voltage. The rear side voltage divider includes a second resistor connected between the first output terminal and a third potential source; and a second output terminal configured to changeably connect to a connection position in the second resistor so as to vary an obtained output voltage. The oscillation unit includes a variable capacitance element with a capacitance varied according to the output voltage from the second output terminal. The oscillation unit varies an output frequency based on a variation in a resonance point associated with a variation in the capacitance.

Effects of the Disclosure

With the voltage controlled oscillator of the disclosure, capacitance of the variable capacitance element at the oscillation unit is controlled by the voltage, which is obtained by division by the front side voltage divider and the rear side voltage divider, so as to control the oscillation frequency. Accordingly, since the resonance point of the oscillation unit can be finely varied in multiple stages based on the variation in the capacitance, the voltage controlled oscillator can control the output frequency with high accuracy.

DESCRIPTION OF PREFERRED EMBODIMENTS

First Embodiment

Figure 1:
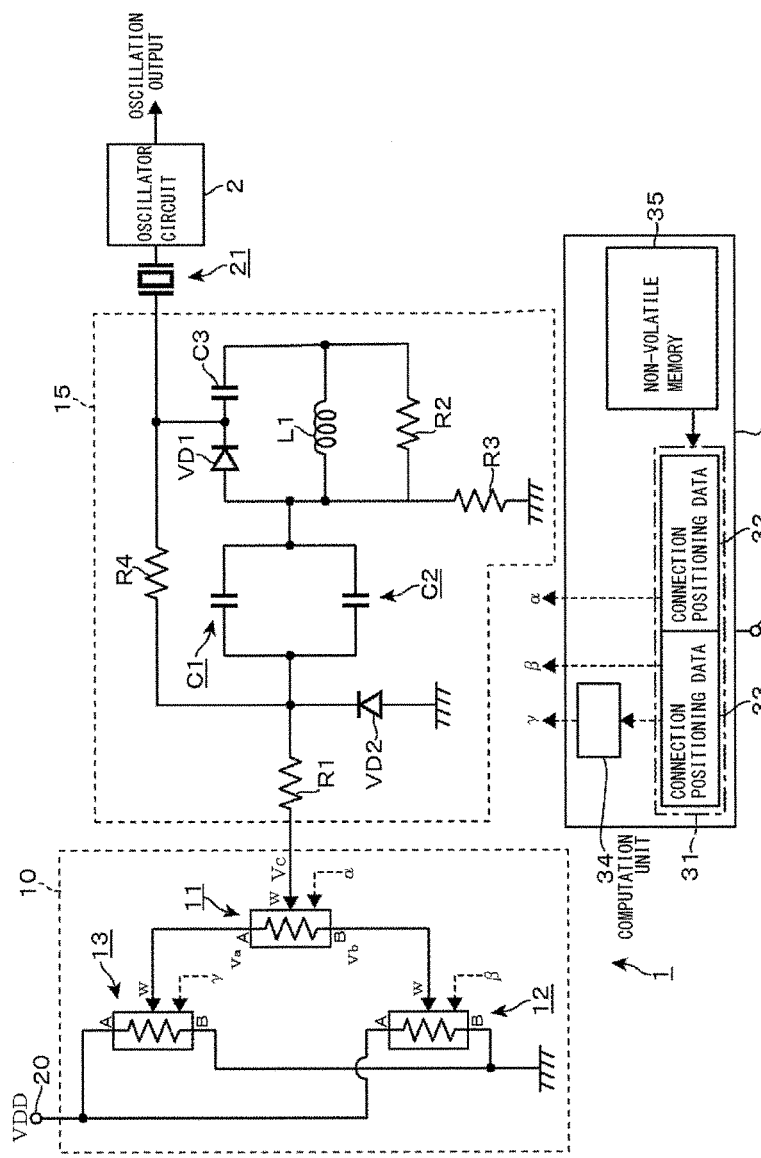
FIG. 1 is a circuit diagram illustrating a crystal controlled oscillator according to a first embodiment.

A VCXO 1, which is an embodiment of a voltage controlled oscillator according to the disclosure, will be described with reference to FIG. 1, which is a circuit diagram thereof. The VCXO 1 includes a frequency adjustment circuit, an oscillator circuit 2, and a crystal unit 21 as a piezoelectric resonator. The frequency adjustment circuit is constituted by an oscillation frequency control voltage adjustment unit 10 and a resonance unit 15. The resonance unit 15 is located in a rear stage of the oscillation frequency control voltage adjustment unit 10. The oscillator circuit 2 is connected to a rear stage of the resonance unit 15 via the crystal unit 21. In the drawing, reference numeral 20 denotes a supply voltage supply terminal to which a preset predetermined supply voltage VDD is applied. This supply voltage VDD is divided by the oscillation frequency control voltage adjustment unit 10 and supplied to the resonance unit 15.

The oscillation frequency control voltage adjustment unit 10 includes three digital potentiometers (DPOTs) 11 to 13, and these DPOTs 11 to 13 are connected in two stages to the supply voltage supply terminal 20. Specifically, the DPOTs 12 and 13 are connected in parallel to the supply voltage supply terminal 20 and Ground. The DPOT 11 is connected to a rear stage of these DPOTs 12 and 13. A detail description will be given of the DPOTs 11 to 13 below.

A description will be given of the resonance unit 15. This resonance unit 15 includes a variable capacitance element for adjusting an output frequency from the oscillator circuit 2, and capacitance of this variable capacitance element varies when an output voltage supplied from the oscillation frequency control voltage adjustment unit 10 (a control voltage Vc) varies. This changes a resonance point between this variable capacitance element and an inductance component included in the resonance unit 15, the crystal unit 21, and the oscillator circuit 2, and thereby changes an oscillation frequency output from the oscillator circuit 2. An output from the oscillator circuit 2 corresponds to an output of the VCXO 1.

A configuration of the resonance unit 15 will be specifically described. The resonance unit 15 includes a resistor R1 and capacitors C1 and C2. The resistor R1 is located in a rear stage of the DPOT 11. The capacitors C1 and C2 are connected one another in parallel with the resistor R1. In addition, an anode of a varicap diode VD1, one end of an inductor L1, one end of a resistor R2, and one end of a resistor R3 are connected one another in parallel with the capacitors C1 and C2. A cathode of the varicap diode VD1 is connected to the other end of the inductor L1 and the other end of the resistor R2 via a capacitor C3. The other end of the resistor R3 is grounded.

One end of a resistor R4 and a cathode of a varicap diode VD2 are each connected between a connection point of front sides of the capacitors C1 and C2 and the resistor R1. An anode of the varicap diode VD2 is grounded. The other end of the resistor R4 is connected to the crystal unit 21 and between the cathode of the varicap diode VD1 and the capacitor C3.

The varicap diode VD2 is a variable capacitance element provided for adjusting the output frequency of the VCXO 1 and varies its capacitance according to the output voltage from the DPOT 11 as described above. Here, assuming that the inductor L1, the capacitor C3, and the varicap diode VD1 are called a parallel connection circuit, when the capacitance of the varicap diode VD2 varies, the capacitance of the varicap diode VD1 is also varied in this parallel connection circuit, and inductance of the parallel connection circuit is also varied. Accordingly, the resonance unit is configured such that a variable amount in the oscillation frequency is increased by a variation in the capacitance of the varicap diode VD2 and a variation in the inductance of the parallel connection circuit. The resonance unit 15 may be configured without this parallel connection circuit. The resistor R2 is provided for avoiding an LC oscillation of the parallel connection circuit. It should be noted that a circuit configuration of the resonance unit 15 illustrated in FIG. 1 indicates one example of the embodiment. As long as the resonance unit 15 is configured to include the voltage controlled variable capacitance element for adjusting the output frequency, any circuit configuration may be employed.

The oscillator circuit 2 is located in a rear stage of the crystal unit 21. The oscillator circuit 2 is constituted by, for example, a well-known Colpitts oscillator circuit and includes an NPN type transistor, for example, in order to amplify and output an input from the resonance unit 15. The oscillation unit is constituted by the oscillator circuit 2, the resonance unit 15, and the crystal unit 21.

Figure 2:
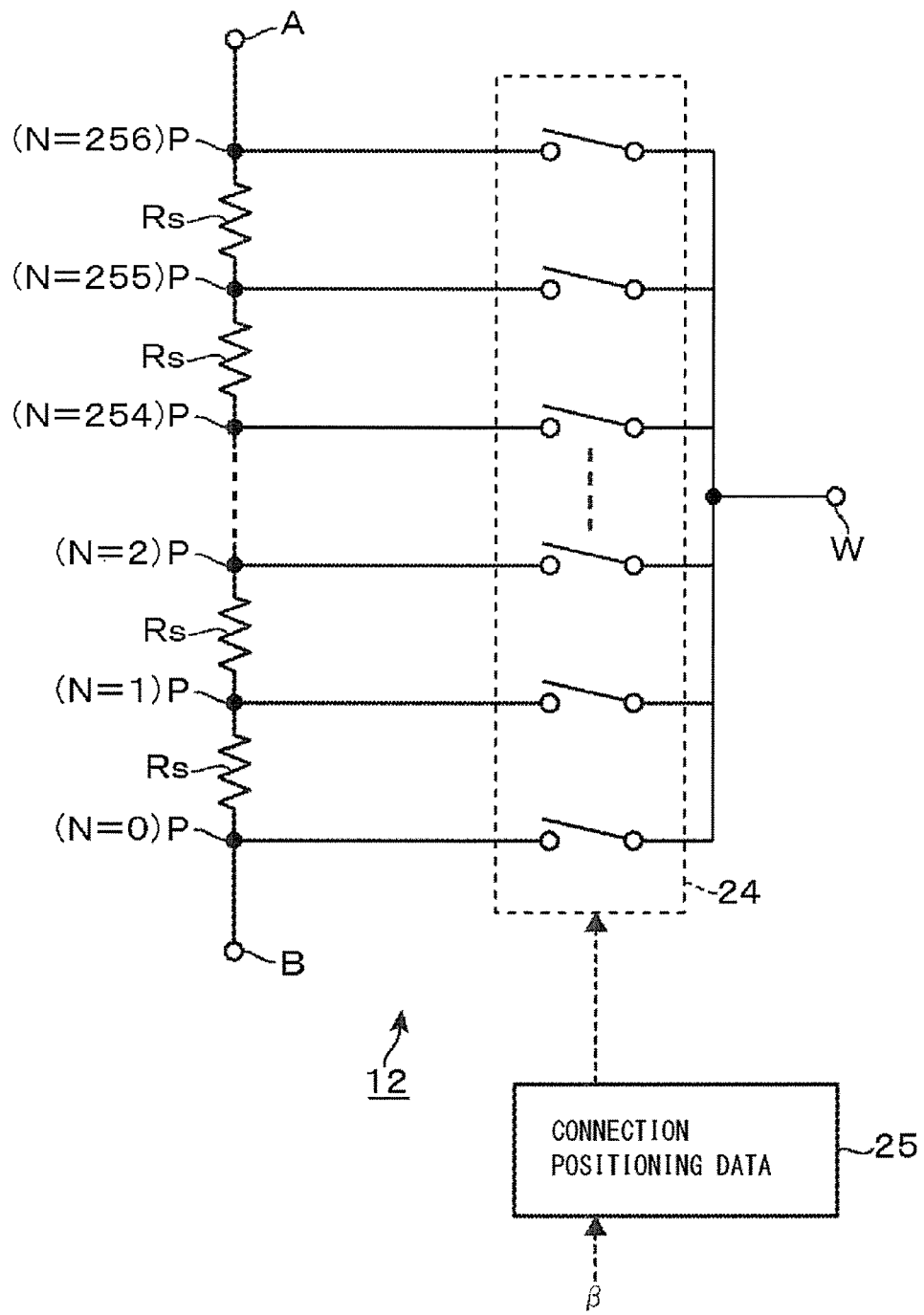
FIG. 2 is a conceptual diagram illustrating a digital potentiometer included in the crystal controlled oscillator.

Next, a description will be given of the DPOT. The well-known DPOTs 11 to 13 are employed. FIG. 2 illustrates a conceptual diagram of the DPOT 12. The DPOT 12 includes an A terminal, a B terminal, and a W (wiper) terminal. Many resistors Rs, which are connected in series, are located between the A terminal and the B terminal. Assuming that points P represent: between the resistors Rs, and between the A terminal or the B terminal and the resistor Rs, the W terminal is a switchable terminal configured to be connectable to any one of the many points P by an operation of a switch 24. The resistors Rs are configured such that respective resistance values between the two points P become equal one another. The number of taps of this DPOT 12, that is, the number of the points P connectable to the W terminal is 257, and the points P to which the W terminal is connectable is represented as a numerical value of N=0 to 256 in the drawing. That is, N indicates a connection position to the W terminal, and the number of N is assumed to increase as approaching the A terminal in this example.

In addition, the DPOT 12 includes a volatile memory 25, for example. Data for setting whether connection to the W terminal for each of the above connection positions N is turned on or off (W terminal connection positioning data) is stored in the memory 25, and the switch 24 is operated based on the W terminal connection positioning data stored in the memory 25. Then, one point P represented by any numerical value of N=0 to 256 is connected to the W terminal, and all the other points P are not connected to the W terminal. Here, when a point that is actually connected to the W terminal represents a connection point P0 among the points P, the W terminal connection positioning data may be data for setting a resistance value between the connection point P0 and the A terminal and a resistance value between the connection point P0 and the B terminal.

The DPOT 13 is configured in the same way as the DPOT 12, and the one point P represented by any numerical value of N=0 to 256 is connected to the W terminal. The DPOT 12 and the DPOT 13 constitute a front side voltage divider. Each of the resistors Rs of the DPOT 12 and the DPOT 13 constitutes a first resistor, and each of the W terminals of the DPOT 12 and the DPOT 13 constitutes a first output terminal. In addition, in this example, the number of taps of the DPOT 11 is 256. That is, the DPOT 11 is configured such that the one point P represented by any numerical value of N=0 to 255 is connected to the W terminal. The DPOT 11 is configured in the same way as the DPOT 13, except for the number of this connection position N. The DPOT 11 constitutes a rear side voltage divider. Each of the resistors Rs of the DPOT 11 constitutes a second resistor, and the W terminal of the DPOT 11 constitutes a second output terminal.

A description will be given by returning to FIG. 1. Each of the A terminals of the DPOTs 12 and 13 is connected to the supply voltage supply terminal 20, and each of the B terminals thereof is connected to Ground. The supply voltage supply terminal 20 constitutes a first potential source, and Ground constitutes a second potential source. The W terminal of the DPOT 12 and the W terminal of the DPOT 13 are connected to the B terminal of the DPOT 11 and the A terminal of the DPOT 11, respectively. The W terminal of the DPOT 11 is connected to the resistor R1. Since the connection is made just as described, these DPOTs 11 to 13 are used in a divider mode, that is, a voltage divider.

In the case where the digital potentiometer is used in the divider mode, when the point P to which the W terminal is connected as described above represents a connection point P0, the output voltage from the W terminal is determined by the ratio of the resistance value between the A terminal and the connection point P0 to the resistance value between the B terminal and the connection point P0. Thus, a variation in the resistance value between the A terminal and the connection point P0 due to a temperature and a variation in the resistance value between the B terminal and the connection point P0 due to a temperature cancel each other. In addition, even if a value of each of the resistors Rs has a design error, and thereby, the resistance value between the A terminal and the connection point P0 and the resistance value between the B terminal and the connection point P0 each have the design error, the ratio cancels this error.

The digital potentiometer may be used in a rheostat mode, that is, it is used as a variable resistor. Specifically, it may be considered that the variable resistor is floated without connecting the B terminal to Ground, for example. However, in this case, the output voltage from the W terminal is determined from a total value of the resistance value between the A terminal and the connection point P0 and the resistance value between the connection point P0 and the W terminal, and this total value is varied by the temperature and displaced by the design error of the resistors Rs. Therefore, in the case where the digital potentiometer is used in the above divider mode, in comparison with the case where the digital potentiometer is used in the rheostat mode, a variation in the output voltage due to the temperature and the design error of the output voltage is small. Accordingly, this has an advantage that an output voltage VW from the W terminal can be controlled with high accuracy and thus the accuracy of an oscillation output from the oscillator circuit 2 can improve.

The W terminals of the DPOT 11 and the DPOT 12 are set to be connected to the point P with any N by a microprocessor 3, which will be described below. The W terminal of the DPOT 13 is set to be connected to the point P with the number of N that is one larger than the point P to which the W terminal of the DPOT 12 is connected. Therefore, the DPOTs 11 to 13 each can change the output by 8 bits, that is, at 256 phases, or by 9 bits, that is, at 257 phases.

Respective voltages are applied to the A terminal and the B terminal such that a potential difference of 1/256 of a potential difference between the supply voltage supply terminal 20 and Ground is generated between a voltage Va that is applied to the A terminal of the DPOT 11 and a voltage Vb that is applied to the B terminal of the DPOT 11. Then, the DPOT 11 divides the thus applied voltage into 256 phases and outputs the divided voltage from the W terminal. Accordingly, these DPOTs 11 to 13 can adjust a voltage VDD that is applied to the supply voltage supply terminal 20 with a resolution of 16 bits (256×256=65536) and output the adjusted voltage to the rear side. As described above, the DPOTs 12 and 13 of the front side have a role in performing a rough adjustment of the voltage, while the DPOT 11 of the rear side has a role in performing a fine adjustment of the output voltage.

The microprocessor 3, which is a control unit of the VCXO 1, includes a register 31 that ensures storing data of for example, 16 bits. The register 31 is illustrated by including a storage area that stores data for low-order 8 bits, which is denoted by reference numeral 32, and a storage area that stores data for high-order 8 bits, which is denoted by reference numeral 33. The storage areas 32 and 33 store the W terminal connection positioning data used for the DPOT 11 and the DPOT 12, respectively. That is, the connection positioning data stored in these storage areas 32 and 33 are output to the respective memories 25 of the DPOT 11 and the DPOT 12, and the points P with the connection position N specified by respective connection positioning data are connected to the W terminal one another.

The microprocessor 3 includes, for example, a computation unit 34. The W terminal connection positioning data stored in the storage area 33 is also output to this computation unit 34. The computation unit 34 outputs the connection positioning data for specifying that N, which is one larger than N specified so as to be connected to the W terminal by the input W terminal connection positioning data, so as to be connected to the W terminal to the memory 25 of the DPOT 13. That is, the computation unit 34 is provided for converting the W terminal connection data for the DPOT 12 into the W terminal connection data for the DPOT 13.

The microprocessor 3 includes EEPROM or a non-volatile memory 35 that is equivalent to this, rewritable, and can hold data even if power source is turned off. The W terminal connection data for the DPOT 11 and the W terminal connection data for the DPOT 12 are stored in this memory 35. When the power source of the VCXO 1 is turned on, each address data of the memory 35 is loaded into each corresponding address of the register 31.

Figure 3:
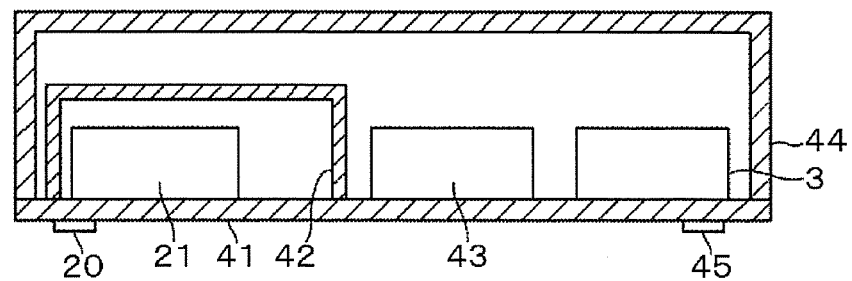
FIG. 3 is a schematic cross-sectional view illustrating the crystal controlled oscillator.

FIG. 3 illustrates a schematic longitudinal sectional side view of this VCXO 1. In the drawing, reference numeral 41 and reference numeral 42 denote a substrate and an inner cover that surrounds the periphery of the crystal unit 21, respectively. In the substrate 41, the microprocessor 3 and an integrated circuit component 43 are located outside the inner cover 42. The integrated circuit component 43 is constituted by integrating respective circuit components that constitute the oscillation frequency control voltage adjustment unit 10, the resonance unit 15, and the oscillator circuit 2. Then, an outer cover 44 is located on the substrate 41 so as to surround the inner cover 42, the microprocessor 3, and the integrated circuit component 43, and covers a surface of the substrate 41. The inside of the inner cover 42 contains an inert gas atmosphere such as a nitrogen gas atmosphere or a vacuum to prevent oxidation of the crystal unit 21. Since the integrated circuit component 43 is more hardly deteriorated than the crystal unit 21, the inside of the outer cover 44 may contain an air atmosphere. However, the outer cover 44 also contains the nitrogen gas atmosphere in the same way as the inner cover to prevent oxidation surely.

A terminal 45, which is connected to the microprocessor 3, and the voltage VDD supply terminal 20 are located on a back surface of the substrate 41. When the above-described register 31 and memory 35 of the microprocessor 3 are accessed from the outside of the VCXO 1 via the connection terminal 45, the stored W terminal connection positioning data is rewritable.

When the power source of the VCXO 1 is turned on and the VCXO 1 is activated, the W terminal connection positioning data for the DPOTs 11 and 12 is loaded into the register 31 from the memory 35. The loaded W terminal connection positioning data are written in the respective memories 25 of the DPOTs 11 and 12. In addition, the W terminal connection positioning data for the DPOT 12 is output from the register 31 to the computation unit 34, converted into the W terminal connection positioning data for the DPOT 13, and written in the memory 25 of the DPOT 13. Then, the W terminal is connected to the points P with the connection position N specified by the W terminal connection positioning data that is written in the respective memories 25 of the DPOT 11 to the DPOT 13. Then the voltage VDD applied to the terminal 20 is divided by the DPOT 11 to the DPOT 13 and supplied to the rear side. Capacitance values of the varicap diodes D1 and D2 become the value that corresponds to the voltages. Control voltages that correspond to these capacitance values are output to the crystal unit 21 and the oscillator circuit 2. The oscillation frequency that corresponds to the control voltage is output from the oscillator circuit 2.

A user of the VCXO 1 measures the frequency output in such way. When the frequency deviates from a reference range, the user rewrites the W terminal connection positioning data of the storage areas 32 and 33 of the register 31 from an external device connected to the VCXO 1, deviates the connection position N of each of the W terminals of the DPOT 11 to the DPOT 13, and adjusts the frequency so as to obtain the output frequency within the reference range. As described above, since a resolution of the control voltage output to the rear side by the DPOT 11 to the DPOT 13 is very high, the capacitance values of the varicap diodes D1 and D2 can be finely adjusted, and the oscillation output from the oscillator circuit 2 can be adjusted with high accuracy so as to be within the reference range.

After the W terminal connection positioning data of the register 31 is thus changed, update the W terminal connection positioning data of the memory 35 so as to be the identical data as the data of the changed register 31. Thereafter, when the power source of the VCXO 1 is turned off and turned on again, since the W terminal connection positioning data of the memory 35 is loaded into the register 31 as described above, the output frequency of the oscillator circuit 2 is output so as to be within the reference range from the beginning of the activation of the VCXO 1. With the VCXO 1, since the output frequency can be finely changed in multiple stages as described above, the oscillation output can be adjusted to a desired value with high accuracy.

The microprocessor 3 is provided in the above configuration example, however, the microprocessor 3 does not need to be provided. In such case, for example, the substrate 41 is configured such that the terminal connected to the integrated circuit component 43 is provided on the back surface of the substrate 41 and the respective memories 25 of the DPOTs 11 to 13 can be directly accessed from the outside of the VCXO 1 via this terminal. After the power source of the VCXO 1 is turned on, the connection position N of each of the W terminals of the DPOTs 11 to 13 may be adjusted by writing the W terminal connection data in the memory 25 from the external device via the terminal. In this case, the memory 25 may be configured as a volatile memory. Since the configuration as a non-volatile memory does not delete the W terminal connection data even if the power source of the VCXO 1 is turned off, the connection position N of the W terminals does not need to be set by writing this positioning data in the each memory 25 every time the power source is turned on. Accordingly, this advantageously ensures the reduced operation.

In the above example, the W terminal connection positioning data is stored in the non-volatile memory 35 inside the microprocessor 3, however, instead of such a configuration, the connection positioning data may be configured so as to be stored in an external non-volatile memory for the VCXO 1 and be loaded into the register 31 from this external memory.

Figure 4:
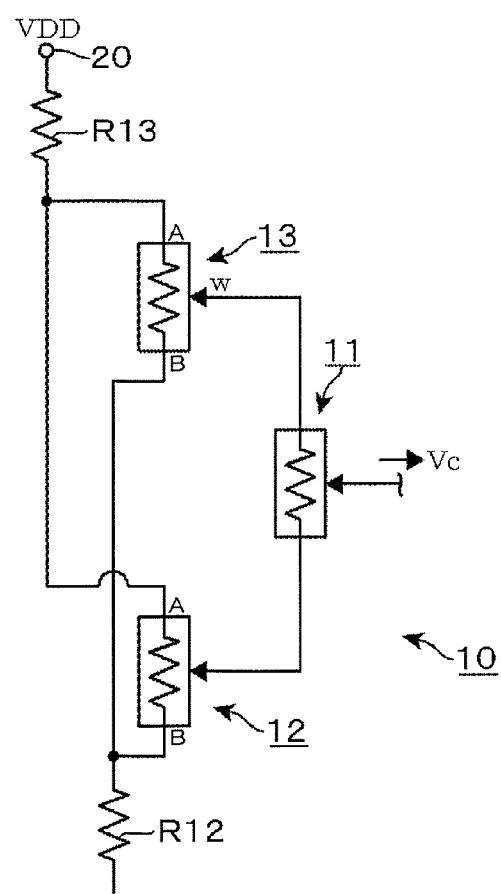
FIG. 4 is an explanatory drawing illustrating an example of another connection of the digital potentiometer.

In order to adjust a range of the output voltage Vc, a resistor may be appropriately provided between the supply voltage supply terminal 20 and Ground. Specifically, as shown in FIG. 4 for example, a resistor R13 can be provided between a connection point of the A terminals of the DPOTs 12 and 13 and the supply voltage supply terminal 20. In addition, a resistor R12 may be provided between a connection point of the B terminals of the DPOTs 12 and 13 and Ground. Connecting a constant voltage generation circuit such as a reference voltage source, instead of the external supply voltage VDD, to the supply voltage supply terminal 20 of the oscillation frequency control voltage adjustment unit 10, ensures providing an oscillator that does not depend on the external supply voltage with increased stability.

Second Embodiment

Figure 5:
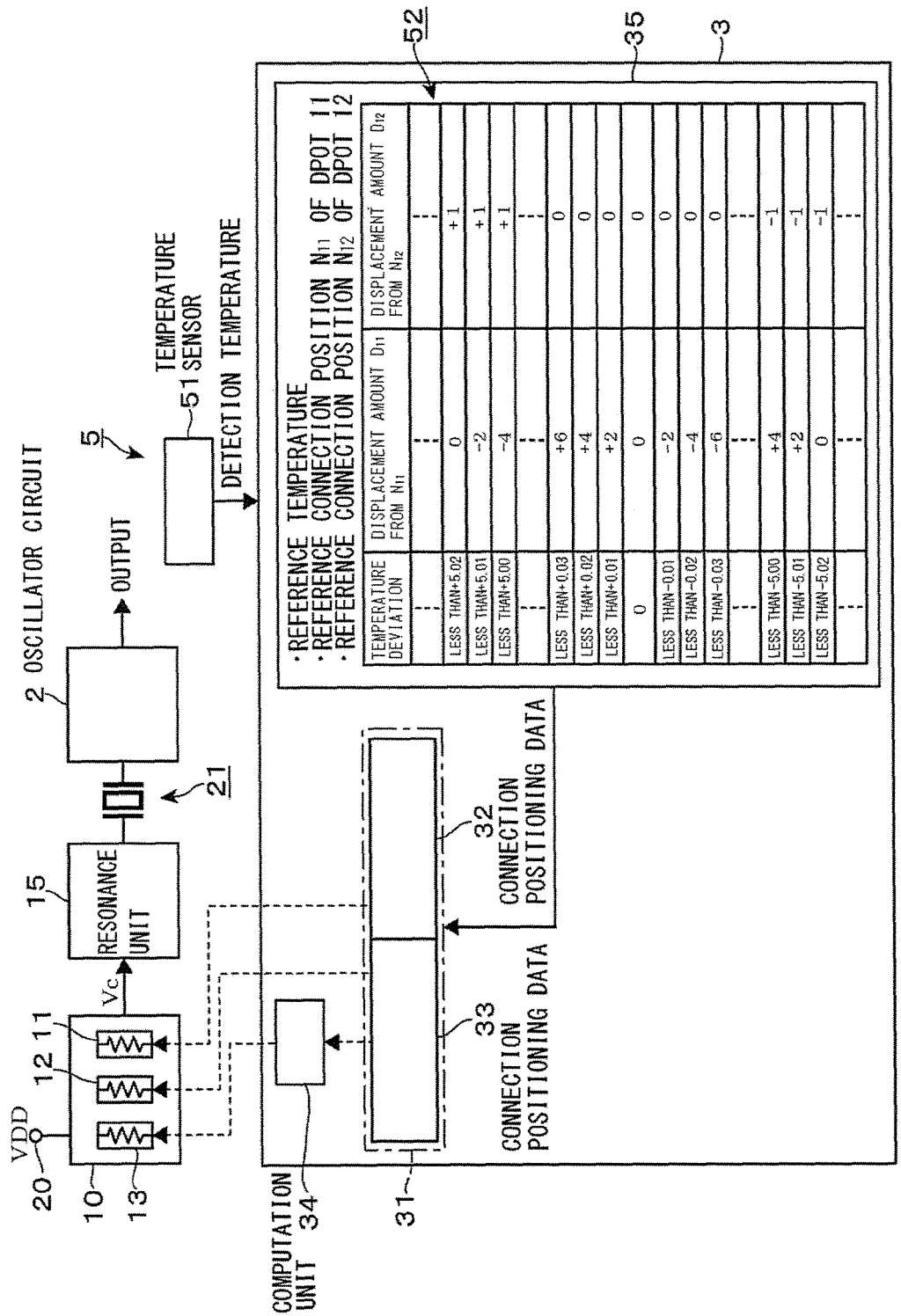
FIG. 5 is a block diagram illustrating a crystal controlled oscillator according to a second embodiment.

Subsequently, a VCXO 5, which is a second embodiment, will be described with reference to a block diagram of FIG. 5, with a focus on a difference from the first embodiment. In this VCXO 5, the oscillation frequency control voltage adjustment unit 10, the resonance unit 15, the crystal unit 21, and the oscillator circuit 2 are configured in the same way as the first embodiment. This VCXO 5 includes a temperature sensor 51, and is configured such that the connection position N of the W terminals of the DPOTs 11 to 13 is automatically controlled based on temperature detection results of this temperature sensor 51 to suppress a variation in the oscillation frequency of the VCXO 5 due to an operating environmental temperature. The temperature sensor 51 is arranged near the crystal unit 25 on the substrate 41, for example, inside the inner cover 42, in order to detect an ambient temperature of the crystal unit 25. The temperature sensor 51 outputs a signal that corresponds to a detection temperature to the microprocessor 3.

A reference temperature, and a reference connection position of the W terminals of the DPOTs 11 and 12 are stored in the above memory 35 of the microprocessor 3. The reference connection position refers to the connection position N that is preset so as to connect each of the W terminals of the DPOTs 11 and 12 when the detection temperature by the temperature sensor 51 is equal to the reference temperature. The reference connection position of the DPOT 11 and the reference connection position of the DPOT 12 are represented as $N_{11}$ and $N_{12}$, respectively.

A table 52 is stored in the memory 35. This table 52 stores a temperature deviation (unit: ° C.), which is a value obtained by subtracting the detection temperature from the reference temperature, a displacement amount $D_{11}$ of the DPOT 11 from the reference connection position $N_{11}$, and a displacement amount $D_{12}$ of the DPOT 12 from the reference connection position $N_{12}$, which are made to correspond to one another.

After the power source of the VCXO 5 is turned on, the temperature deviation is computed from the detection temperature detected by the temperature sensor 51 and the reference temperature in the memory 35. Then, the displacement amounts $D_{11}$ and $D_{12}$ that correspond to this temperature deviation are each read out from the table 52. Specifically, as shown in the drawing for example, when the computed temperature deviation is +5.00° C. while assuming that the table 52 is set, −2 and +1 that are the displacement amounts $D_{11}$ and $D_{12}$ corresponding to the temperature deviation of less than +5.01° C. in the table 52 are read out, respectively.

Thereafter, $N_{11}+D_{11}$ is computed and this computed value is determined as the value of N that corresponds to the point P to which the W terminal of the DPOT 11 is connected. In addition, $N_{12}+D_{12}$ is computed and this computed value is determined as the value of N that corresponds to the point P to which the W terminal of the DPOT 12 is connected. The connection positioning data equivalent to the value of N, which is determined in such way, is input to the register 31. After the data is input to the register 31, the data written in the register 31 is output to the DPOTs 11 and 12 in the same way as the first embodiment, and each of the W terminals of the DPOTs 11 and 12 is connected to the point P of the determined connection position N. In addition, the connection positioning data of the DPOT 12 is connected to the DPOT 13 via the computation unit 34, and the W terminal of the DPOT 13 is connected to the point P where the number of N is larger than the DPOT 12 by one. Each of the above processes is performed by a program (not shown) that is provided in the microprocessor 3.

With this VCXO 5, the connection position of each of the W terminals of the DPOTs 11 to 13 is automatically adjusted so as to cancel the variation in the oscillation frequency with respect to a change in the ambient temperature of the crystal unit 25. Therefore, the oscillation frequency from the oscillator circuit 2 can be within a predetermined range with high accuracy in the same way as the first embodiment. In addition, effort of the user needed to adjust the oscillation frequency can be reduced. In the above example, the table 52 is provided, however, instead of the table 52, a calculation formula, which calculates each of the displacement amounts $D_{11}$ and $D_{12}$ based on the temperature deviation, may be stored in the memory 35. With the use of a table, unlike "temperature deviation" versus "displacement amount" like the table 52, but a configuration that has data containing a relationship between the absolute temperatures, which are obtained from the temperature sensor 51, and the connection position data N11 and N12, which are set to DPOT 11 and DPOT 12, for control is also possible.

Third Embodiment

Figure 6:
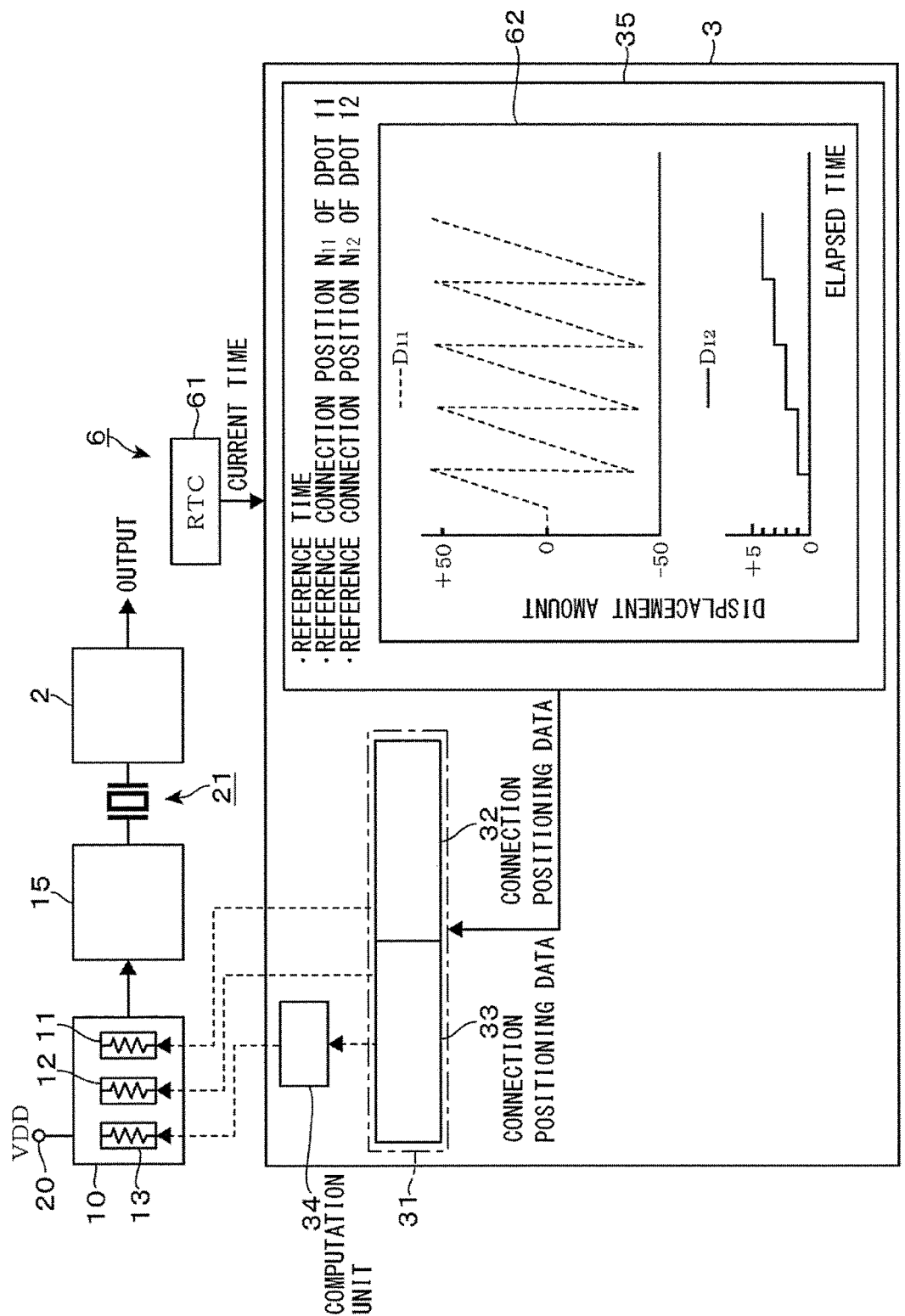
FIG. 6 is a block diagram illustrating a crystal controlled oscillator according to a third embodiment.

Subsequently, a VCXO 6, which is a third embodiment, will be described with reference to a block diagram of FIG. 6, with a focus on a difference from the second embodiment. This VCXO 6 includes a RTC (real time clock) 61, instead of the temperature sensor 51. This RTC 61 includes a built-in battery, is activated even if power source of the VCXO 6 is turned off, and can detect the current time. In addition, the RTC 61 transmits data related to this current time to the microprocessor 3. The VCXO 6 calculates elapsed time from a reference time based on this current time. The reference time refers to the time when an output oscillation frequency is adjusted so as to be within the reference range during a production stage of the VCXO 6, for example. Then, the VCXO 6 corrects the connection position N of the W terminals of the DPOT 11 to the DPOT 13 so as to correct displacement of the oscillation frequency, which corresponds to the elapsed time, based on this elapsed time. That is, this VCXO 6 is configured such that the change in the frequency due to aging can be automatically compensated.

The reference time and the reference connection positions $N_{11}$ and $N_{12}$ of the W terminals of the DPOTs 11 and 12 are stored in the above memory 35 of the microprocessor 3. The reference connection positions $N_{11}$ and $N_{12}$ of the W terminals according to this third embodiment are positions that can output the frequency so as to be within the reference range at the reference time. In addition, two functions that can be represented as a graph 62 in the drawing are stored in the memory 35, for example. One function makes the elapsed time and the displacement amount $D_{11}$ of the DPOT 11 from the reference connection position $N_{11}$ correspond to one another, and the other function makes the elapsed time and the displacement amount $D_{12}$ of the DPOT 12 from the reference connection position $N_{12}$ correspond to one another. These displacement amounts $D_{11}$ and $D_{12}$ are the displacement amounts of the connection position N of the W terminals for compensating the displacement of the frequency that deviates from the reference range due to the aging.

After the power source of the VCXO 6 is turned on, the elapsed time from the reference time is calculated based on the output obtained from the RTC 61 and the reference time stored in advance.

The displacement amounts $D_{11}$ and $D_{12}$ are calculated from the function represented as the above graph 62 based on this elapsed time. Then, $N_{11}+D_{11}$ and $N_{12}+D_{12}$ are computed in the same way as the second embodiment, these computed values are determined as the value of N that corresponds to the point P to which the W terminals of the DPOTs 11 and 12 are connected. Each of the W terminals of the DPOTs 11 to 13 is connected to the point P according to the determined N. Accordingly, the frequency is output so as to be within the reference range from the VCXO 6 as described above.

With this VCXO 6, the connection position of each of the W terminals of the DPOTs 11 to 13 is automatically adjusted so as to cancel the variation in the oscillation frequency by a change with age of the VCXO 6. Therefore, the oscillation frequency from the oscillator circuit 2 can be within a predetermined range with high accuracy in the same way as the first embodiment. In addition, effort of the user needed to adjust the oscillation frequency can be reduced.

The disclosure is not limited to the above configuration as long as the current time can be detected in order to calculate the elapsed time. For example, a timer may be provided in the microprocessor 3, and the current time may be measured by the timer. The timer is configured to be operable by the battery, for example, even if the power source of the VCXO 6 is turned off. In addition, the RTC 61 may be provided in the outer cover 44, or outside the outer cover 44, that is, configured as the external device for the VCXO 6.

A configuration of a crystal controlled oscillator according to the respective embodiments may be combined with one another. For example, the connection position N of the W terminal may be changed by combining the second embodiment and the third embodiment based on both of the elapsed time and the ambient temperature of the crystal unit 25. In addition, the oscillator according to each embodiment may be configured as the voltage controlled oscillator that does not include the crystal unit 21. Furthermore, the W terminal of the DPOT 13 may be connected to N of the number that is larger than the connection position N to which the W terminal of the DPOT 12 is connected by two or more, however, as described in the embodiment, it is advantageous for the W terminal of the DPOT 13 to be connected to N of the number that is larger by one in order to enhance the resolution of the control voltage Vc from the DPOT 11.

Evaluation Test

The VCXO 1 of the first embodiment is fixed such that the W terminal of the DPOT 11 is connected to the point P of the predetermined connection position N. Then, the connection positions N to which the W terminals of the DPOTs 12 and 13 are connected are changed with time. It should be noted that, also in this evaluation test, the W terminal of the DPOT 13 is connected to N of the number that is larger than the connection position N to which the W terminal of the DPOT 12 is connected by one in the same way as the embodiment. As described above, while the connection position N to which the W terminals of the DPOTs 12 and 13 is connected being changed, an oscillation frequency f of the VCXO 1 is measured, and a frequency stability is calculated from this f. This frequency stability is obtained from ((the reference oscillation frequency f0–the oscillation frequency f)/f0).

Figure 7:
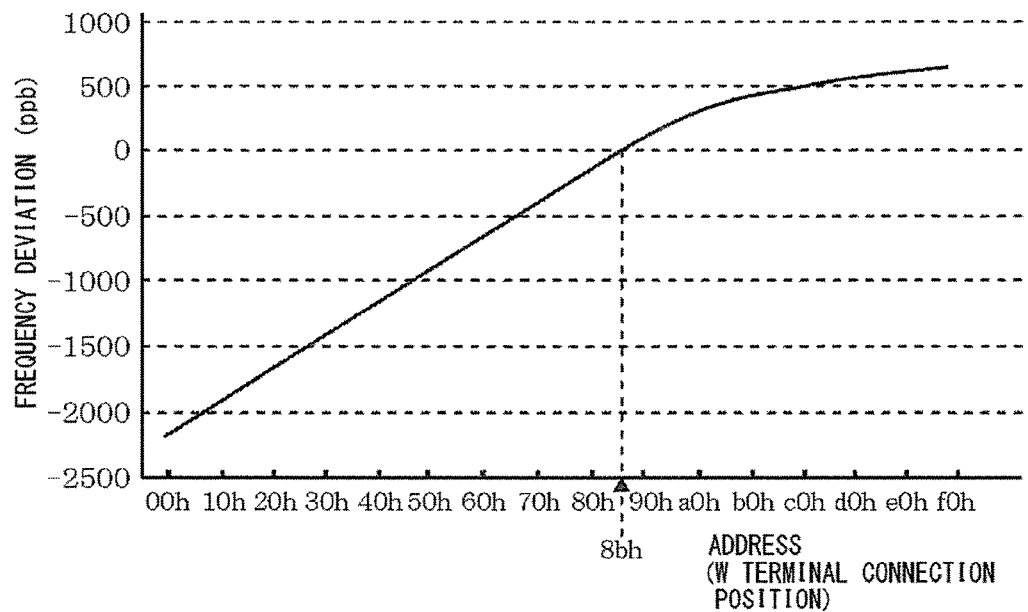
FIG. 7 is a graph illustrating a result of an evaluation test.

A graph of FIG. 7 indicates an example of this result. The longitudinal axis of the graph indicates the frequency deviation (unit: ppb). The horizontal axis of the graph indicates a set value of the storage area 33. More specifically, the set value of the storage area 33 is assigned to each of the points P, and data about whether or not the point P and the W terminal are connected is written. An address indicated in the horizontal axis of the graph is an address where the data in which the point P and the W terminal are connected is written. Accordingly, the address indicated in the horizontal axis of this graph represents the connection position N connected to the point P.

Figure 8:
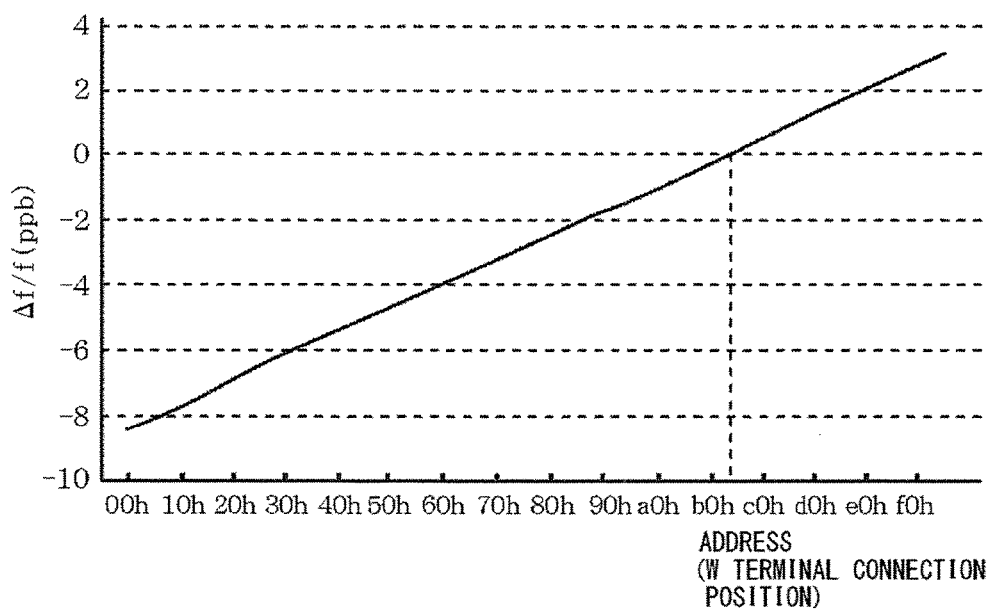
FIG. 8 is a graph illustrating a result of an evaluation test.

As shown in a graph of FIG. 8, the set value of the storage area 33 whose frequency deviation most approached 0 ppb is 8 bh. Next, the connection of the W terminal of the DPOT 12 is fixed so as to connect the point P to the connection position N that corresponds to this address. Accordingly, the connection position N of the W terminal of the DPOT 13 is also fixed. The graph of FIG. 8 illustrates the changing of the connection position N to which the W terminal of the DPOT 11 is connected while the connection of the W terminals of the DPOTs 12 and 13 are fixed in such manner. As described above, the oscillation frequency f of the VCXO 1 is measured and the frequency stability is calculated while the connection position N is being changed. The graph of FIG. 8 is the graph illustrating the relationship between the address, where the data in which the point P and the W terminal are connected, is written and the frequency deviation in the same manner as the graph of FIG. 7. From the graph, it can be understood that the frequency deviation most approaches 0 ppb when the W terminal of the DPOT 11 is connected to the connection position N that corresponds to an address b0h. Then, this frequency deviation is –0.1 ppb and is extremely small. That is, it is demonstrated that the frequency of the VCXO 1 can be adjusted to a target frequency with high accuracy, and thereby the effect of the disclosure was confirmed.

What is claimed is:

1. A voltage controlled oscillator, comprising:
   a front side voltage divider that includes a first resistor connected between a first potential source and a second potential source, and a first output terminal configured to changeably connect to a connection position in the first resistor so as to vary an obtained output voltage;
   a rear side voltage divider that includes a second resistor connected between the first output terminal and a third potential source, and a second output terminal configured to changeably connect to a connection position in the second resistor so as to vary an obtained output voltage; and
   an oscillation unit that includes a variable capacitance element with a capacitance varied according to an output voltage from the second output terminal, the oscillation unit varying an output frequency based on a variation in a resonance point associated with a variation in the capacitance.

2. The voltage controlled oscillator according to claim 1, wherein
   the first potential source is a terminal that supplies a preset supply voltage, and
   the second potential source is Ground.

3. The voltage controlled oscillator according to claim 1, wherein:
   the front side voltage divider is constituted by a first front side voltage divider and a second front side voltage divider connected in parallel with the first potential source and the second potential source, and
   a third potential source is constituted by a first output terminal of one of the first front side voltage divider and the second front side voltage divider.

4. The voltage controlled oscillator according to claim 1, further comprising
   a memory that stores data for the front side voltage divider for controlling an output from the front side voltage divider and data for the rear side voltage divider for controlling an output from the rear side voltage divider, wherein
   the data for the front side voltage divider and the data for the rear side voltage divider in the memory are configured so as to be changeable from outside.

5. The voltage controlled oscillator according to claim 1, wherein:
   the oscillation unit includes a piezoelectric resonator,
   the voltage controlled oscillator further comprises:
      a temperature detection unit configured to detect a temperature in an atmosphere in which the piezoelectric resonator is placed;
      a data storage unit that stores data for the front side voltage divider for controlling an output from the front side voltage divider and data for the rear side voltage divider for controlling an output from the rear side voltage divider at a reference temperature;
      a correspondence relationship storage unit that stores a correspondence relationship between a detection temperature detected by the temperature detection unit and correction data for correcting the data for the front side voltage divider and the data for the rear side voltage divider, in order to compensate a displacement of an output frequency from the oscillation unit due to displacement of a temperature in an atmosphere in which the piezoelectric resonator is placed, from the reference temperature; and
      a control unit configured to correct the data for the front side voltage divider and the data for the rear side voltage divider based on the detection temperature and the correspondence relationship by using the correction data, and control each of output voltages from the front side voltage divider and the rear side voltage divider after the correction data.

6. The voltage controlled oscillator according to claim 1, further comprising:
   a time detection unit configured to detect an elapsed time from a reference time;

a data storage unit that stores data for the front side voltage divider for controlling an output from the front side voltage divider and data for the rear side voltage divider for controlling an output from the rear side voltage divider at the reference time;

a correspondence relationship storage unit that stores a correspondence relationship between the elapsed time and correction data for correcting the data for the front side voltage divider and the data for the rear side voltage divider, in order to compensate a displacement of an output frequency from the oscillation unit due to aging; and a control unit configured to correct the data for the front side voltage divider and the data for the rear side voltage divider based on the elapsed time and the correspondence relationship by using the correction data and control each of output voltages from a front side voltage divider and a rear side voltage divider after the correction data.

7. The voltage controlled oscillator according to claim 1, wherein the front side voltage divider and the rear side voltage divider are digital potentiometers.

\* \* \* \* \*